(12) United States Patent
Xiao et al.

(10) Patent No.: US 12,300,744 B2
(45) Date of Patent: May 13, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Deyuan Xiao, Hefei (CN); Guangsu Shao, Hefei (CN); Yunsong Qiu, Hefei (CN); Yi Jiang, Hefei (CN); Youming Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 418 days.

(21) Appl. No.: 17/935,167

(22) Filed: Sep. 26, 2022

(65) Prior Publication Data
US 2023/0395700 A1 Dec. 7, 2023

Related U.S. Application Data

(63) Continuation of application No. PCT/CN2022/105726, filed on Jul. 14, 2022.

(30) Foreign Application Priority Data

Jun. 2, 2022 (CN) .......................... 202210621768.5

(51) Int. Cl.
*H01L 29/66* (2006.01)
*H01L 29/06* (2006.01)
(Continued)

(52) U.S. Cl.
CPC .... *H01L 29/66666* (2013.01); *H01L 29/0649* (2013.01); *H01L 29/401* (2013.01); *H01L 29/41741* (2013.01)

(58) Field of Classification Search
CPC ........... H01L 29/66666; H01L 29/0649; H01L 29/401; H01L 29/41741; H01L 29/78642; H01L 29/7827
See application file for complete search history.

(56) References Cited

U.S. PATENT DOCUMENTS 8,169,020 B2   5/2012   Cho
8,399,342 B2   3/2013   Kim
(Continued)

FOREIGN PATENT DOCUMENTS

CN   102054820 A   5/2011
CN   103515307 A   1/2014
(Continued)

OTHER PUBLICATIONS

International Search Report cited in PCT/CN2022/105726 mailed Dec. 16, 2022, 8 pages.

*Primary Examiner* — Dao H Nguyen
(74) *Attorney, Agent, or Firm* — Kilpatrick Townsend & Stockton LLP

(57) ABSTRACT

The present disclosure relates to a semiconductor structure and a manufacturing method thereof. The semiconductor structure includes: a base, including a semiconductor substrate, the semiconductor substrate is provided with first trenches extending along a first direction and second trenches extending along a second direction, the first trenches intersect with the second trenches to form a plurality of semiconductor pillars on the semiconductor substrate, the second trench is filled with a first dielectric layer, a second dielectric layer is provided on a top of the semiconductor pillar, and a third dielectric layer is provided on a sidewall of the first trench; an isolation layer, located in the semiconductor substrate below the first trenches and extending along the second direction; and a bit line, located on a surface of the isolation layer and extending along the second direction, the bit line is connected to a bottom of the semiconductor pillar.

20 Claims, 10 Drawing Sheets

(51) Int. Cl.
*H01L 29/40* (2006.01)
*H01L 29/417* (2006.01)

(56) References Cited

U.S. PATENT DOCUMENTS

| | | | |
|---|---|---|---|
| 8,907,393 | B2 | 12/2014 | Myung |
| 9,853,211 | B2 * | 12/2017 | Sills .................... H10N 70/235 |
| 11,600,726 | B2 * | 3/2023 | Han .................. H01L 29/42392 |
| 2013/0323920 | A1 * | 12/2013 | Chang .................... H10B 12/01 |
| | | | 438/586 |
| 2021/0375939 | A1 | 12/2021 | Zhu et al. |
| 2022/0406915 | A1 * | 12/2022 | Shao .................... H10B 12/482 |
| 2023/0013070 | A1 * | 1/2023 | Shao .................... H10B 12/482 |

FOREIGN PATENT DOCUMENTS

| | | |
|---|---|---|
| CN | 103515307 B | 1/2018 |
| CN | 113644066 A | 11/2021 |
| CN | 114121818 A | 3/2022 |

\* cited by examiner

SEMICONDUCTOR STRUCTURE AND MANUFACTURING METHOD THEREOF

CROSS-REFERENCE TO RELATED APPLICATIONS

The present disclosure is a continuation application of International Patent Application No. PCT/CN2022/105726, filed on Jul. 14, 2022, which claims the priority to Chinese Patent Application 202210621768.5, titled "SEMICONDUCTOR STRUCTURE AND MANUFACTURING METHOD THEREOF" and filed with the China National Intellectual Property Administration (CNIPA) on Jun. 2, 2022. The entire contents of International Patent Application No. PCT/CN2022/105726 and Chinese Patent Application 202210621768.5 are incorporated herein by reference.

TECHNICAL FIELD

The present disclosure relates to the technical field of semiconductors, and in particular to a semiconductor structure and a manufacturing method thereof.

BACKGROUND

With development of semiconductor technologies, a gate-all-around (GAA) technology has emerged. The technology features four-sided wrapping of a channel by a gate, allowing the gate to have a stronger control capability on the channel. A GAA transistor includes a vertical gate-all-around (VGAA) transistor, with a channel perpendicular to a substrate.

A bit line of a conventional VGAA is directly manufactured on a surface of a substrate, which is easy to cause an electric leakage between the bit line and the substrate.

SUMMARY

The embodiments of the present disclosure provide a semiconductor structure, including:
  a base, including a semiconductor substrate, where the semiconductor substrate is provided with first trenches extending along a first direction and second trenches extending along a second direction, the first trenches intersect with the second trenches to form a plurality of semiconductor pillars on the semiconductor substrate, the second trench is filled with a first dielectric layer, a second dielectric layer is provided on a top of the semiconductor pillar, and a third dielectric layer is provided on a sidewall of the first trench;
  an isolation layer, located in the semiconductor substrate below the first trenches and extending along the second direction; and
  a bit line, located on a surface of the isolation layer and extending along the second direction, where the bit line is connected to a bottom of the semiconductor pillar.

The embodiments of the present disclosure further provide a manufacturing method of a semiconductor structure, including:
  providing a base, including a semiconductor substrate, where the semiconductor substrate is provided with first trenches extending along a first direction and second trenches extending along a second direction, the first trenches intersect with the second trenches to form a plurality of semiconductor pillars on the semiconductor substrate, the second trench is filled with a first dielectric layer, a second dielectric layer is provided on a top of the semiconductor pillar, and a third dielectric layer is provided on a sidewall of the first trench;
  forming, in the semiconductor substrate below the first trenches, an isolation layer extending along the second direction; and
  forming, on a surface of the isolation layer, a bit line extending along the second direction, where the bit line is connected to a bottom of the semiconductor pillar.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description merely show some embodiments of the present disclosure, and a person of ordinary skill in the art may still derive other drawings from these drawings without creative efforts.

FIG. 6 is a schematic structural top view, and the rest are each a schematic structural cross-sectional view taken along directions aa', bb', cc', and dd', respectively;

FIG. 3 to FIG. 21 are each a schematic structural cross-sectional view of a semiconductor structure in a manufacturing process according to another embodiment;

Figure 1:
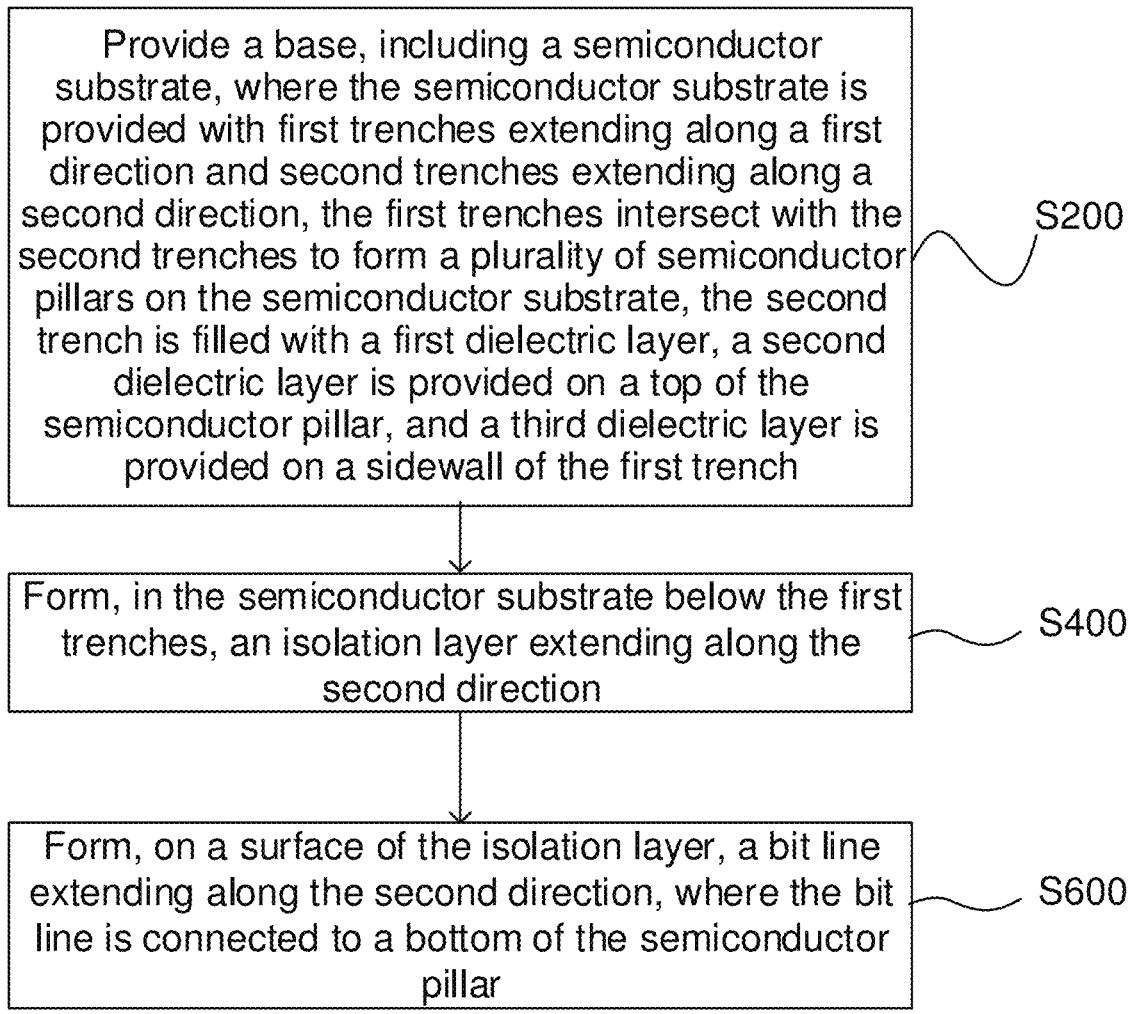
FIG. 1 is a flowchart of a manufacturing method of a semiconductor structure according to an embodiment.

To better describe and illustrate the embodiments and/or examples of the present disclosure, reference may be made to one or more accompanying drawings. Additional details or examples for describing the drawings should not be considered as limitations is on the scope of any one of the present disclosure, the currently described embodiment and/or example, and the optimal mode of the present disclosure as currently understood.

DETAILED DESCRIPTION

To facilitate the understanding of the present disclosure, the present disclosure is described more completely below with reference to the related accompanying drawings. The preferred embodiments of the present disclosure are shown in the accompanying drawings. However, the present disclosure may be embodied in various forms without being limited to the embodiments described herein. On the contrary, these embodiments are provided to make the present disclosure more thorough and comprehensive.

Unless otherwise defined, all technical and scientific terms used in the specification have the same meaning as commonly understood by those skilled in the technical field of the present disclosure. The terms used in the specification of the present disclosure are merely for the purpose of describing specific embodiments, rather than to limit the present disclosure.

It should be understood that when an element or a layer is described as "being on", "being adjacent to", "being connected to" or "being coupled to" another element or layer, it can be on, adjacent to, connected to, or coupled to the another element or layer directly, or intervening elements or layers may be present. On the contrary, when an element is described as "being directly on", "being directly adjacent to", "being directly connected to" or "being directly coupled to" another element or layer, there are no intervening elements or layers. It should be understood that although terms such as first, second, and third may be used to describe various elements, components, regions, layers, doped types and/or sections, these elements, components, regions, layers, doped types and/or sections should not be limited by these terms. These terms are only used to distinguish one element, component, region, layer, doping type or section from another element, component, region, layer, doping type or section. Therefore, without departing from the teachings of the present application, a first element, component, region, layer, doping type or section discussed below may be a second element, component, region, layer, doping type or section. For example, the first doping type may be the second doping type, is and similarly, the second doping type may be the first doping type; or the first doping type and the second doping type are different doping types, for example, the first doping type may be P-type and the second doping type may be N-type, or the first doping type may be N-type and the second doping type may be P-type.

Spatial relationship terms such as "under", "beneath", "lower", "below", "above", and "upper" can be used herein to describe the relationship shown in the figure between one element or feature and another element or feature. It should be understood that in addition to the orientations shown in the figure, the spatial relationship terms further include different orientations of used and operated devices. For example, if a device in the accompanying drawings is turned over, an element or feature described as being "beneath another element", "below it", or "under it" is oriented as being "on" the another element or feature. Therefore, the exemplary terms "beneath" and "under" may include two orientations of above and below. In addition, the device may further include other orientations (for example, a rotation by 90 degrees or other orientations), and the spatial description used herein is interpreted accordingly.

In the specification, the singular forms of "a", "an" and "the/this" may also include plural forms, unless clearly indicated otherwise. It should also be understood that the terms such as "including/comprising" and "having" indicate the existence of the stated features, wholes, steps, operations, components, parts or combinations thereof. However, these terms do not exclude the possibility of the existence of one or more other features, wholes, steps, operations, components, parts or combinations thereof. In this case, in this specification, the term "and/or" includes any and all combinations of related listed items.

Figure 6:
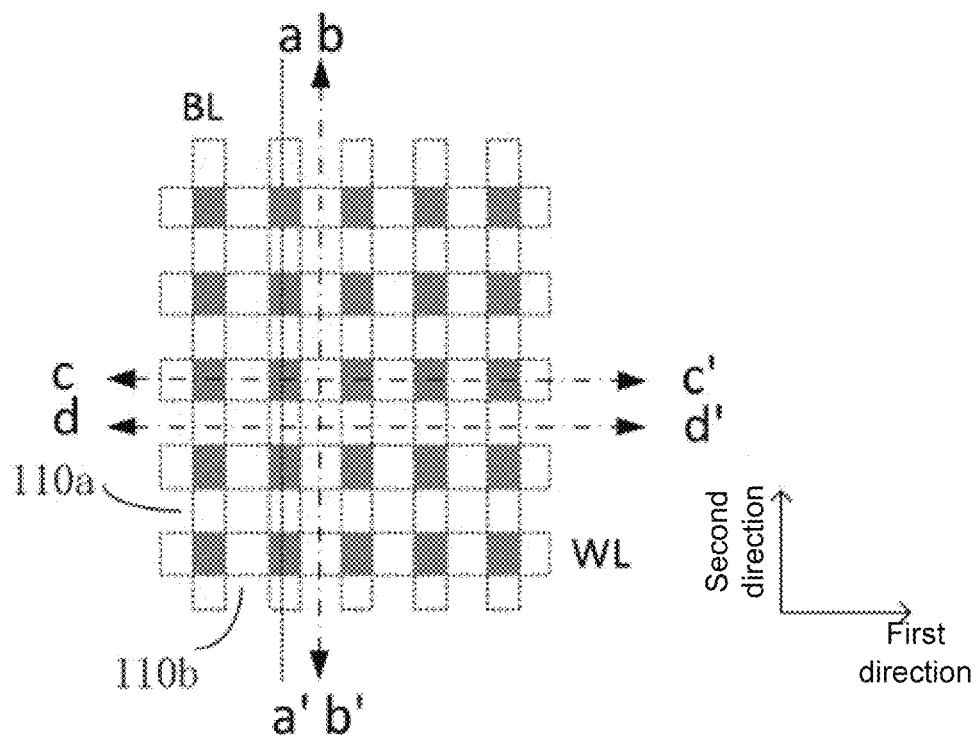
Figure 7:
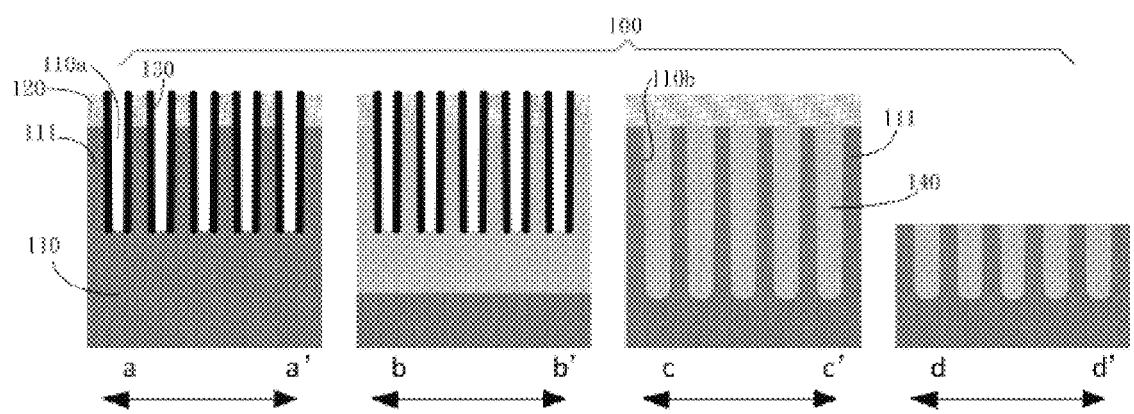

In an embodiment, referring to FIG. 1, the present disclosure provides a manufacturing method of a semiconductor structure, including the following steps:

Step S200: Referring to FIG. 6 and FIG. 7, provide a base 100, including a semiconductor substrate 110, where the semiconductor substrate 110 is provided with first trenches 110a extending along a first direction and second trenches 110b extending along a second direction, the first trenches 110a intersect with the second trenches 110b to form a plurality of semiconductor pillars 111 on the semiconductor substrate 110, the second trench 110b is filled with a first dielectric layer 140, a second dielectric layer 120 is provided on a top of the semiconductor pillar 111, and a third dielectric layer 130 is is provided on a sidewall of the first trench.

Figure 11:
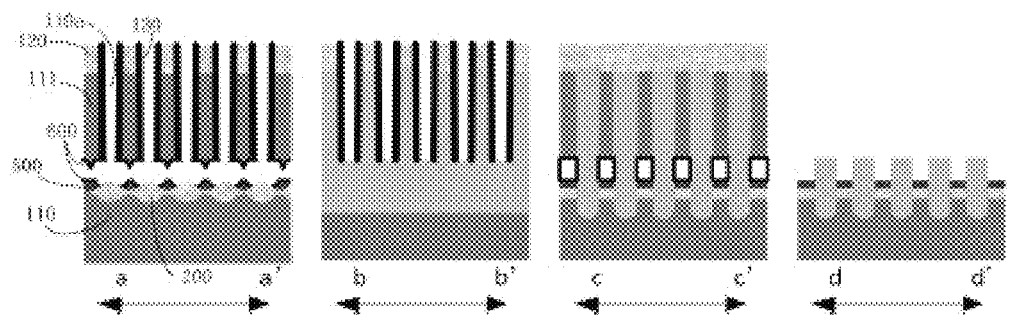

Step S400: Referring to FIG. 11, form, in the semiconductor substrate 110 below the first trench 110a, an isolation layer 200 extending along the second direction.

Figure 15:
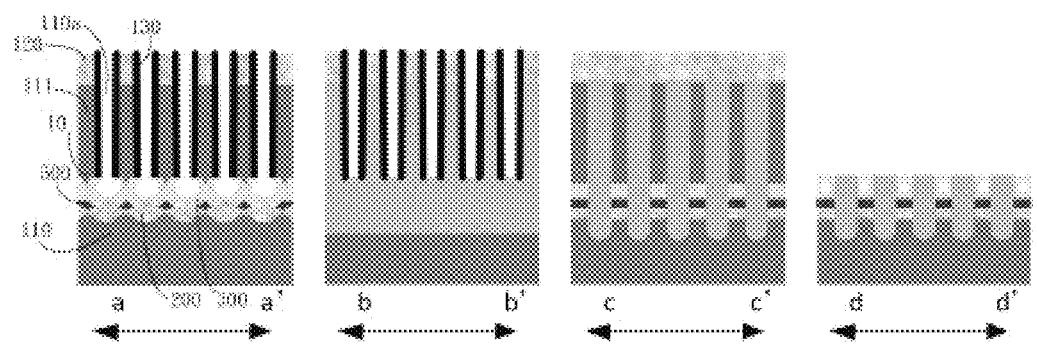

Step S600: Referring to FIG. 15, form, on the isolation layer 200, a bit line 300 extending along the second direction, where the bit line 300 is connected to the bottom of the semiconductor pillar 111.

In step S200, a process of forming the base 100 may include:

Step S210: Provide the semiconductor substrate 110. A material of the semiconductor substrate 110 may include silicon, germanium, germanium silicon, or the like.

Figure 2:
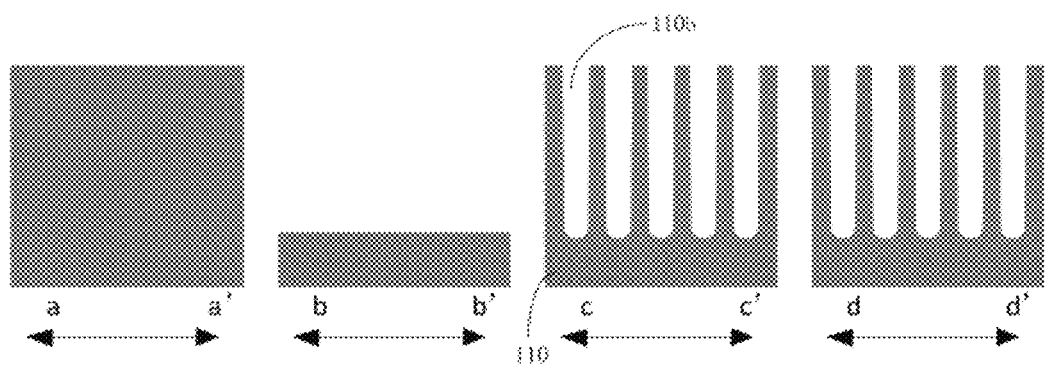
FIG. 2 to FIG. 16 are each a schematic structural diagram of a semiconductor structure in a manufacturing process according to an embodiment, where

Step S220: Referring to FIG. 2, etch the semiconductor substrate 110 to form a plurality of second trenches 110b extending along the second direction. In an example, the plurality of second trenches 110b may be arranged in parallel and at equal intervals in a column, and two sides of the second trench 110b are used to form a bit line BL of a transistor structure.

Figure 3:
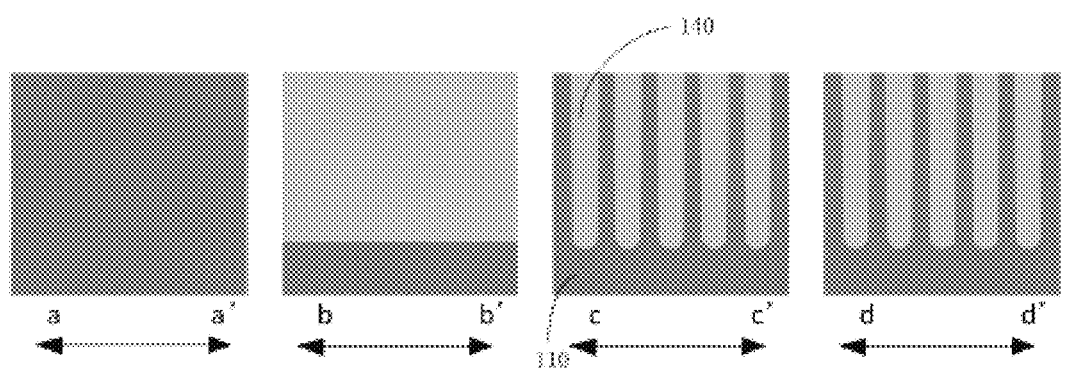

Step S230: Referring to FIG. 3, fill the second trench 110b with the first dielectric layer 140. A material of the first dielectric layer 140 may include, but is not limited to any one or more of silicon dioxide, silicon nitride, silicon oxynitride, and the like.

Figure 4:
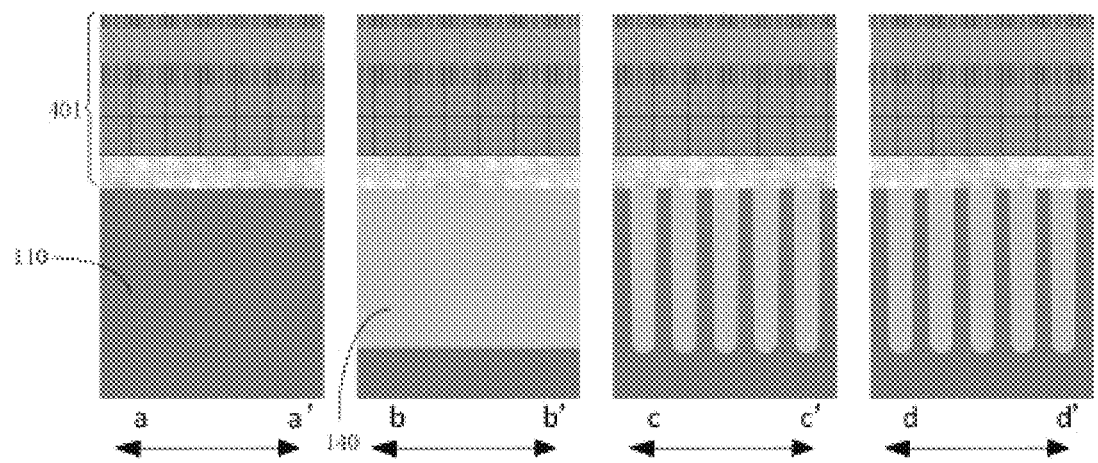

Step S240: Referring to FIG. 4, form a mask material layer 401 on a surface of the semiconductor substrate 110 in which the second trench 110b has been formed and on a surface of the first dielectric layer 140. The mask material layer 401 may include a single material film layer or a plurality of material film layers. In an example, when including a plurality of material film layers, the mask material layer 401 may include an oxide material layer, an amorphous carbon material layer, a first silicon oxynitride (SION) material layer, a spin on hardmask (SOH) material layer, and a second silicon oxynitride (SION) material layer that are formed by sequential lamination.

Step S250: Pattern the mask material layer 401 to form a mask layer (not shown).

Figure 5:
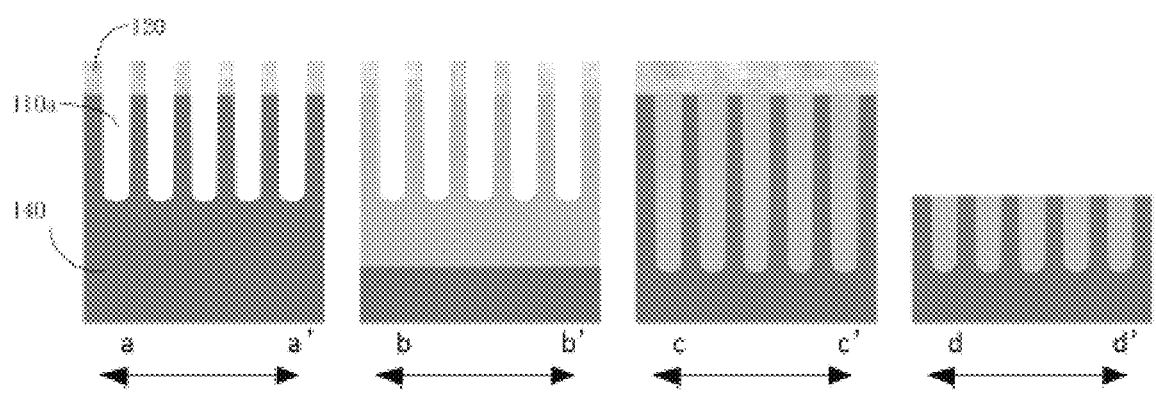

Step S260: Referring to FIG. 5, etch the semiconductor substrate 110 based on the mask layer to form a plurality of first trenches 110a extending along the first direction. In an example, the plurality of first trenches 110a may be arranged in parallel and at equal intervals in a row. A trench depth of the first trench 110a may be less than that of the second trench 110b. Two sides of the first trench 110a are used to form a word line (WL) of a transistor structure.

Herein, when the mask material layer 401 includes a plurality of material film layers, after the material film layers are patterned, the formed mask layer also includes a plurality of film layers. In this case, after formation of the first trench 110a, the bottommost patterned material film layer (for example, a patterned oxide material layer) may be retained as the second dielectric layer 120. In addition, other film layers of the mask layer may be removed. Certainly, the formation of the second dielectric layer 120 is not limited to this manner. For example, the filling the second trench 110b with the first dielectric layer 140 in step S230 may include forming an insulating material layer on the second trench 110b and a surface of the semiconductor substrate 110, and then planarizing a material layer of the first dielectric layer 140. A surface of the remaining material layer of the first dielectric layer 140 is above the surface of the semiconductor substrate 110, an insulating material layer thereof located in the second trench 110b constitutes the first dielectric layer 140, and a portion above the surface of the semiconductor substrate 110 may be etched in step S260 and then form the second dielectric layer 120. A material of the second dielectric layer 120 may include, but is not limited to any one or more of silicon dioxide, silicon nitride, silicon oxynitride, and the like.

Step S270: Referring to FIG. 7, form the third dielectric layer 130 on a sidewall of the first trench 110a. A material of the third dielectric layer 130 may include, but is not limited to any one or more of silicon dioxide, silicon nitride, silicon oxynitride, and the like.

The first trenches 110a intersect with the second trenches 110b to form a plurality of semiconductor pillars 111 on the semiconductor substrate 110. The formed top and bottom of the semiconductor pillar 111 may be heavily doped and then form a source region and a drain region, respectively. A part between the source region and the drain region may be completely surrounded by a gate in a subsequent part, thereby allowing formation of a conductive channel.

Figure 12:
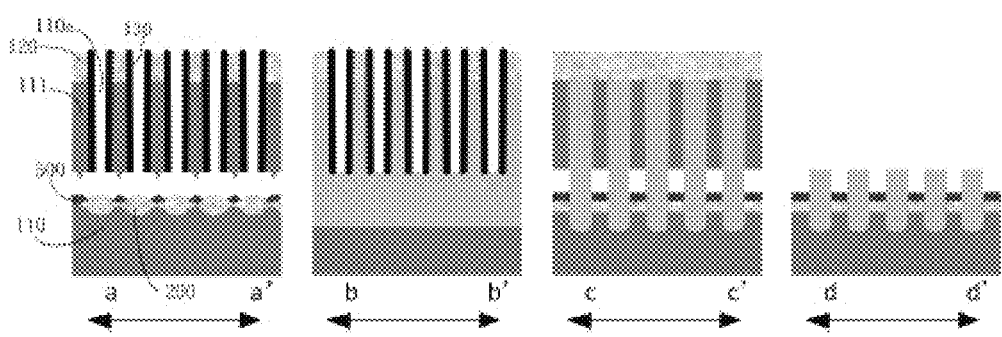

In step S400, referring to FIG. 12, the isolation layer 200 is formed in the semiconductor substrate 110. Specifically, a plurality of parallel isolation layers 200 may be formed in the semiconductor substrate 110. In addition, the isolation layers 200 and the second trenches 110b both extend along the second direction and the two are is alternately arranged.

A material of the isolation layer 200 may include, but is not limited to any one or more of silicon dioxide, silicon nitride, silicon oxynitride, and the like.

In step S600, referring to FIG. 15, the bit line 300 is connected to the bottom of the semiconductor pillar 111 to provide a voltage for a source region or a drain region formed at the bottom of the semiconductor pillar 111. It can be understood that, the bit line 300 and the semiconductor pillar 111 may be directly connected or may be connected through an intermediate layer (for example, a metal silicide 10). This is not limited herein.

The bit line 300 is formed on the isolation layer 200. A plurality of bit lines are formed on a plurality of isolation layers 200. Therefore, the bit lines are also alternately arranged with the second trenches 110b.

A material of the bit line 300 may include, but is not limited to metal Mo, Co, W, Ti, and the like.

In this embodiment, the bit line 300 is formed on the isolation layer 200, such that a current path between the bit line 300 and the bottom of the semiconductor substrate 110 is blocked, thereby effectively reducing an electric leakage between the bit line 300 and the semiconductor substrate 110.

Figure 9:
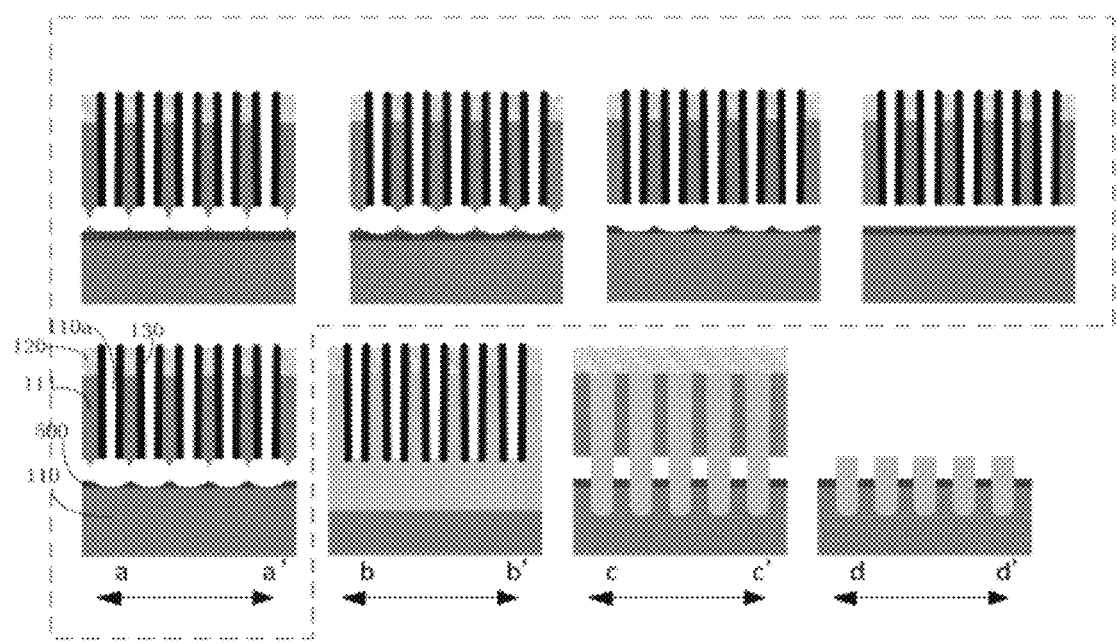

In an embodiment, before step S400, the manufacturing method further includes:

Step S300: Referring to FIG. 9, etch the semiconductor substrate 110 below the first trench 110a to cut off the semiconductor pillar 111.

Through cutting off of the semiconductor pillar 111, a space is formed between the semiconductor pillar 111 and the semiconductor substrate 110 below the semiconductor pillar 111. In this case, this may help form the isolation layer 200 and the bit line 300 between the semiconductor pillar 111 and the semiconductor substrate 110 below the semiconductor pillar 111 subsequently.

Figure 8:
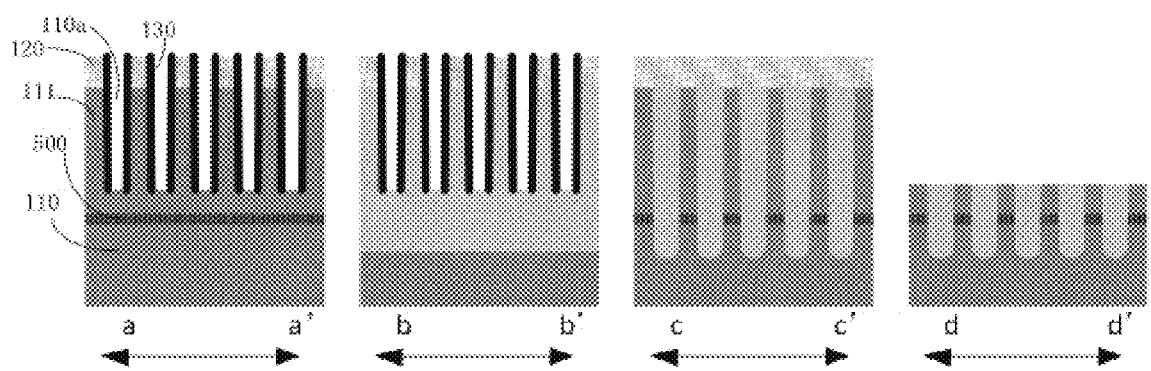

In an embodiment, step S300 includes:

Step S311: Referring to FIG. 8, form, below the first trench 110a, an etch barrier layer 500 extending along the second direction, where the etch barrier layer 500 is located in the semiconductor substrate 110 and is spaced apart from the first trench 110a.

Step S312: Referring to FIG. 9, etch the semiconductor substrate 110 below the first trench 110a based on the etch barrier layer 500 to cut off the semiconductor pillar 111.

In step S311, referring to FIG. 8, the bottom of the etch barrier layer 500 may be higher than a trench bottom of the second trench 110b, such that the etch barrier layer 500 is not formed at a position with the second trench 110b. Therefore, in this case, the etch barrier layers 500 may also extend along the second direction to be alternately arranged with the second trenches 110b.

There is a gap between the etch barrier layer 500 and the first trench 110a, such that the semiconductor substrate 110 therebetween can be etched.

In step S312, referring to FIG. 9, during etching based on the etch barrier layer 500, longitudinal etching stops on the etch barrier layer 500 while horizontal etching cuts off the semiconductor pillar 111.

In an example, an etching solution or an etching gas may be injected into the first trench 110a. In this case, because the first dielectric layer 140 is provided in the second trench 110b, the second dielectric layer 120 is provided on the top of the semiconductor pillar 111, and the third dielectric layer 130 is provided on the sidewall of the first trench 110a, the etching starts from the semiconductor substrate 110 exposed at the bottom of the first trench 110a to its surroundings. The semiconductor pillar 111 is cut off through etching below the first trench 110a.

Five drawings in a dashed box in FIG. 9 are five different schematic structural diagrams taken along a direction aa' and formed under different etching conditions when the semiconductor pillar 111 is cut off through etching below the first trench 110a.

In this embodiment, the etch barrier layer 500 is provided, such that the semiconductor pillar 111 can be effectively cut off. Certainly, in some embodiments, the etch barrier layer 500 may not be provided, which is not limited herein.

In this embodiment, the isolation layer 200 formed in step S400 and the bit line 300 formed in step S600 can jointly fill the portion removed by etching below the first trench 110a. After the formation of the isolation layer 200 in step S400, there is still a gap between the isolation layer 200 and the semiconductor pillar 111, and the gap can be filled with the bit line 300.

In an embodiment, in step S311, ion implantation may be performed on the semiconductor substrate 110 to form the etch barrier layer 500 in the semiconductor substrate 110. Specifically, the etch barrier layer 500 may be formed by implanting B ions, is Be ions, Li ions, Mg ions, Ca ions, and the like.

Herein, after the formation of the first trench 110a, ion implantation is performed on the semiconductor substrate 110 to form the etch barrier layer 500.

However, other embodiments are not limited thereto. For example, alternatively, ion implantation may be performed on the semiconductor substrate 110 after the second trench 110b is formed and the second trench 110b is filled with the first dielectric layer 140 and before the first trench 110a is formed, to form the etch barrier layer 500. Alternatively, ion implantation may be first performed on the semiconductor substrate 110 before other processing is performed on the semiconductor substrate 110, to form the etch barrier layer 500.

Figure 10:
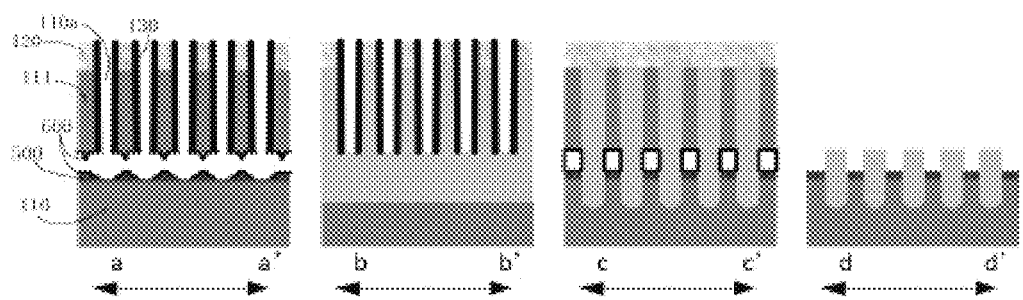

In an embodiment, after step S312, step S400 includes:

Step S411: Referring to FIG. 10, form a sacrificial layer 600 on a bottom surface of the semiconductor pillar 111 and the etch barrier layer 500 and/or partial surface of the semiconductor substrate 110 opposite thereto.

Step S412: Referring to FIG. 11, perform thermal oxidation on the etch barrier layer 500 and/or the semiconductor substrate 110 exposed by the sacrificial layer 600 to form the isolation layer 200, where the isolation layer 200 is beak-shaped at a portion opposite to the semiconductor pillar 111.

In addition, correspondingly, before step S600, the manufacturing method further includes:

Step S511: Referring to FIG. 12, remove the sacrificial layer 600.

In step S411, a sacrificial material layer (not shown) may be first formed on each surface of a structure obtained after the semiconductor pillar 111 is cut off. In an example, the sacrificial material layer may be deposited, through atomic layer deposition (ALD), on each surface of the structure obtained after the semiconductor pillar 111 is cut off.

Then, the sacrificial material layer may be etched back. In this case, due to the masking of the semiconductor pillar 111, the sacrificial material layer located on the bottom surface of the semiconductor pillar 111 and the sacrificial material layer located on the portion of the surface of the etch barrier layer 500 and/or the semiconductor substrate 110 opposite to the semiconductor pillar 111 may be retained to form the sacrificial layer 600. A material of the sacrificial layer 600 may include, but is not limited is to any one or more of silicon dioxide, silicon nitride, silicon oxynitride, and the like.

Herein, it can be understood that, in an actual process, in a process of etching the semiconductor substrate 110 below the first trench 110a based on the etch barrier layer 500 to cut off the semiconductor pillar 111 (step S312), the etch barrier layer 500 may also be etched to some extent.

In an example 1, referring to FIG. 10, the etch barrier layer 500 may be partially etched, but still masks the semiconductor substrate 110 below the etch barrier layer 500. In this case, the sacrificial layer 600 is formed on the bottom surface of the semiconductor pillar 111 and is also formed on the portion of the surface of the etch barrier layer 500 opposite to the semiconductor pillar 111.

In an example 2, the etch barrier layer 500 may alternatively be completely etched to completely expose the semiconductor substrate 110 below the etch barrier layer 500. In this case, the sacrificial layer 600 is formed on the bottom surface of the semiconductor pillar 111 and is also formed on the portion of the surface of the semiconductor substrate 110 opposite to the semiconductor pillar 111.

In an example 3, the etch barrier layer 500 is partially etched and then cut off, and an edge of the portion of the etch barrier layer 500 opposite to the semiconductor pillar 111 is removed by etching. In this case, the sacrificial layer 600 is formed on the bottom surface of the semiconductor pillar 111 and may also be formed on the portion of the surface of each of the etch barrier layer 500 and the semiconductor substrate 110 opposite to the semiconductor pillar 111.

In an example 4, the etch barrier layer 500 is partially etched and then cut off, but is still present in a portion of a region between the semiconductor pillars 111. In this case, the sacrificial layer 600 is formed on the bottom surface of the semiconductor pillar 111 and is also formed on the portion of the surface of the etch barrier layer 500 opposite to the semiconductor pillar 111.

In step S412, specifically, for the case of the foregoing example 1, thermal oxidation may be performed on the etch barrier layer 500 exposed by the sacrificial layer 600. For the cases of the foregoing example 2 and example 3, thermal oxidation may be performed on the semiconductor substrate 110 exposed by the sacrificial layer 600. For the case of the foregoing example 4, thermal oxidation may be performed on both the semiconductor is substrate 110 and the etch barrier layer 500 that are exposed by the sacrificial layer 600.

In addition, during the thermal oxidation, oxygen ions can have a diffusion effect in the film layer. Therefore, in addition to being formed between the semiconductor pillars 111 (that is, at a position where the sacrificial layer 600 is exposed), the isolation layer 200 may also be extended and formed at a position opposite to the semiconductor pillar 111 (that is, a position covered by the sacrificial layer 600). In this case, the isolation layer 200 is beak-shaped at a portion opposite to the semiconductor pillar 111. In this case, this helps make the isolation layer 200 continuous in the second direction, thereby well preventing an electric leakage.

Certainly, in some examples, the isolation layer 200 may alternatively not be continuous in the second direction (for example, nearly continuous but not continuous), which is not limited herein.

Specifically, after the formation of the isolation layer 200 in step S400, there is still a gap between the isolation layer 200 and the semiconductor pillar 111.

Figure 13:
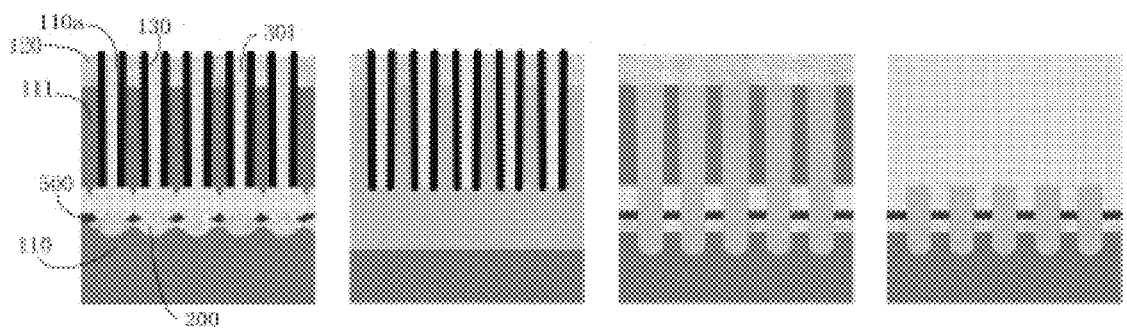
Figure 14:
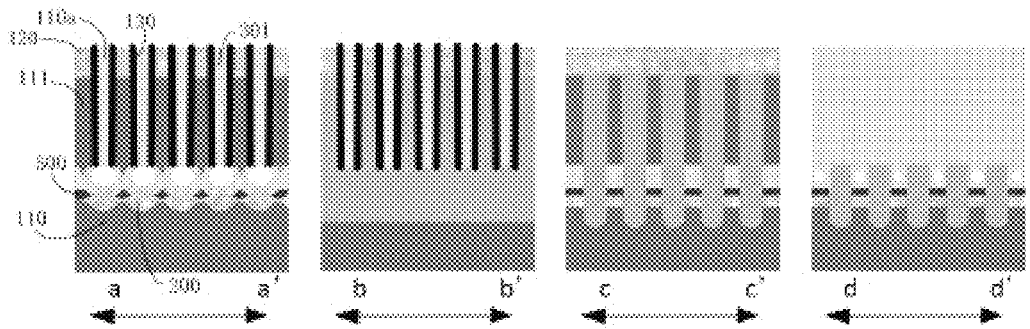

In this case, referring to FIG. 13 or FIG. 14, in step S600, the first trench 110a and a region between the isolation layer 200 and the semiconductor pillar 111 may be first filled with the bit line material layer 301. For example, filling of the bit line material layer 301 may be performed through ALD. A material of the bit line material layer 301 may be selected from Mo, Co, W, Ti, and the like. A filling effect of a material of the bit line material layer 301 may vary depending on an actual process. In some examples, referring to FIG. 14, there are gaps in the bit line material layer 301, and in some other examples, referring to FIG. 13, the bit line material layer 301 may be well filled without any intermediate gap.

Then, referring to FIG. 15, the bit line material layer 301 may be etched back to form the bit line 300.

In an embodiment, after step S312 (referring to FIG. 9), step S400 includes:

Step S421: Fill the first trench 110a and a region between the semiconductor pillar 111 and the semiconductor substrate 110 with an isolation material layer 201.

Figure 17:
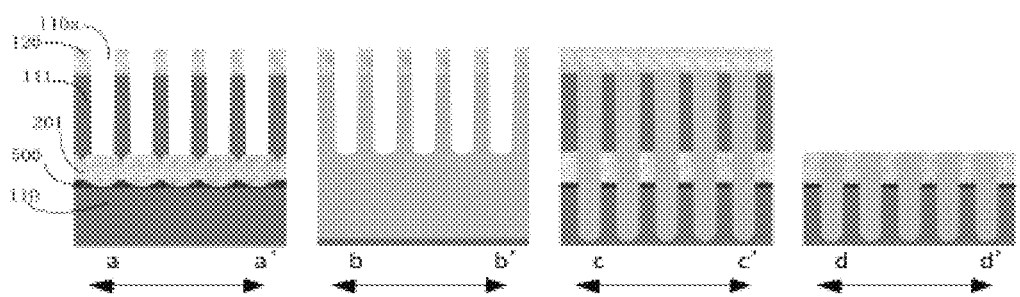

Step S422: Referring to FIG. 17, etch back the isolation material layer 201 to the bottom of the semiconductor pillar 111.

Figure 18:
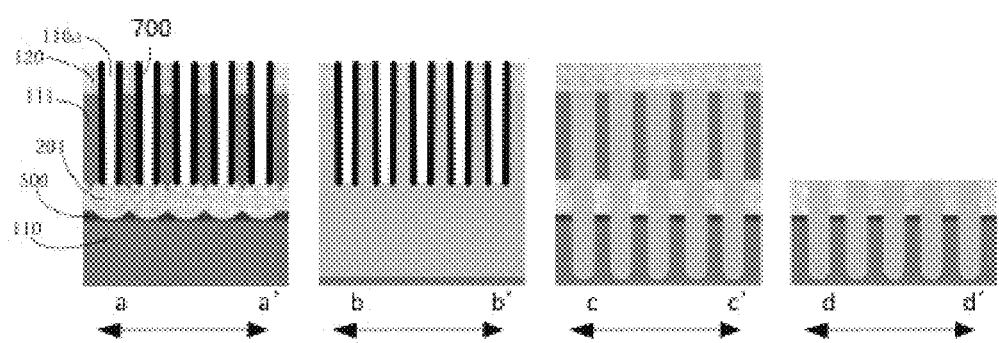

Step S423: Referring to FIG. 18, form a supplementary dielectric layer 700 on a sidewall of the first trench 110a.

Figure 19:
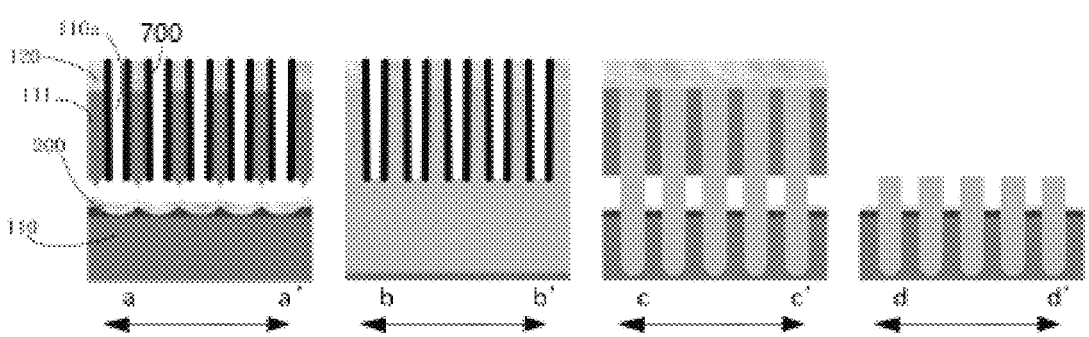

Step S424: Referring to FIG. 19, etch back the isolation material layer 201 to form the isolation layer 200 on the etch barrier layer 500 and/or the semiconductor substrate 110.

In step S421, a material of the isolation material layer may include, but is not limited to any one or more of silicon dioxide, silicon nitride, silicon oxynitride, and the like.

In step S422, when the isolation material layer and the third dielectric layer 130 on the sidewall of the first trench 110a are made of the same material or have a relatively small etch selectivity, the third dielectric layer 130 may be removed while the isolation material layer is etched back.

In step S423, a material of the supplementary dielectric layer 700 may include, but is not limited to any one or more of silicon dioxide, silicon nitride, silicon oxynitride, and the like. The material of the supplementary dielectric layer 700 may be selectively a material having a relatively large etch selectivity with the isolation material layer. In an example, when the material of the isolation material layer is silicon nitride, the supplementary dielectric layer 700 may be selectively silicon dioxide.

In step S424, the isolation material layer is further etched back, such that the isolation layer 200 having a gap with the semiconductor pillar 111 can be formed, and the gap between the two can subsequently form the bit line 300.

Referring to FIG. 19, after the semiconductor pillar 111 is cut off, its bottom may have a sharp corner due to process reasons. Charges tend to accumulate at the sharp corner. In this step, after the isolation material layer is etched back, the sharp corner at the bottom of the semiconductor pillar 111 may be oxidized to remove the sharp corner and then remove an oxide layer formed at the sharp corner. In this case, charges accumulating at the sharp corner can be effectively reduced.

As described above, in the process of step S312, the etch barrier layer 500 may also be etched to some extent. Specifically, the etch barrier layer 500 may be partially etched, but still masks the semiconductor substrate 110 below the etch barrier layer 500. Alternatively, the etch barrier layer 500 may be completely etched to completely expose the semiconductor substrate 110 below the etch barrier layer 500. Alternatively, the etch barrier layer 500 is partially etched and cut off to partially expose the semiconductor substrate 110 below the etch barrier layer 500.

Therefore, the isolation material layer is further etched back, such that the isolation layer 200 may be formed on the etch barrier layer 500, or the isolation layer 200 may be formed on the semiconductor substrate 110, or the isolation layer 200 may be formed on both the etch barrier layer 500 and the semiconductor substrate 110.

In this embodiment, the isolation layer 200 is formed by etching back the isolation material layer, thereby helping form a continuous isolation layer 200 along the second direction.

In addition, in this embodiment, the isolation material layer is etched back twice, and after the first time of etching back, the supplementary dielectric layer 700 is formed again on the sidewall of the first trench 110*a*, such that the semiconductor pillar 111 can be effectively prevented from being damaged during the etching back of the isolation material layer.

Certainly, in some embodiments, the isolation material layer may alternatively be etched back once. Specifically, after step S312, step S400 includes:

Step S431: Fill the first trench 110*a* and a region between the semiconductor pillar 111 and the semiconductor substrate 110 with an isolation material layer (not shown).

Step S432: Etch back the isolation material layer to form the isolation layer 200 on the etch barrier layer 500 and/or the semiconductor substrate 110.

In this case, in an example, a material of the formed isolation material layer may be selectively a material having a relatively large etch selectivity with the third dielectric layer 130 on the sidewall of the first trench 110*a*.

Figure 22:
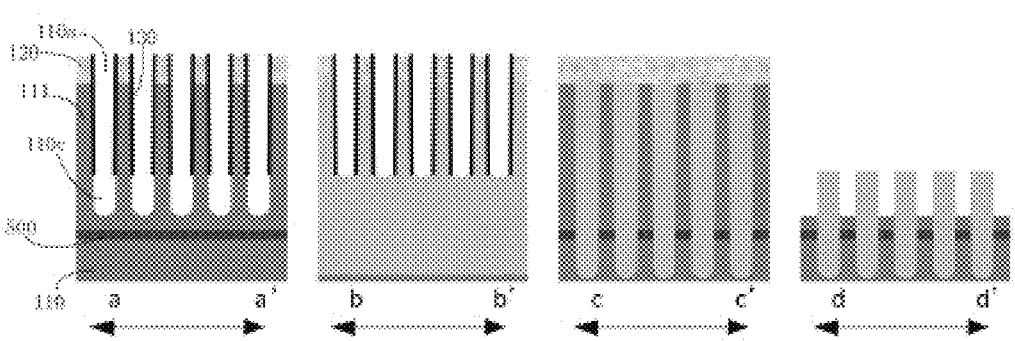
FIG. 22 to FIG. 28 are each a schematic structural cross-sectional view of a semiconductor structure in a manufacturing process according to still another embodiment.

In an embodiment, when step S300 is further included before step S400, step S300 includes:

Step S321: Referring to FIG. 22, form, below the first trench 110*a*, an etch barrier layer 500 extending along the second direction, where the etch barrier layer 500 is spaced apart from the first trench 110*a*.

Step S322: Still referring to FIG. 22, etch the semiconductor substrate 110 at the bottom of the first trench 110*a* to form a third trench 110*c*, where the third trench 110*c* is spaced apart from the etch barrier layer 500.

Figure 23:
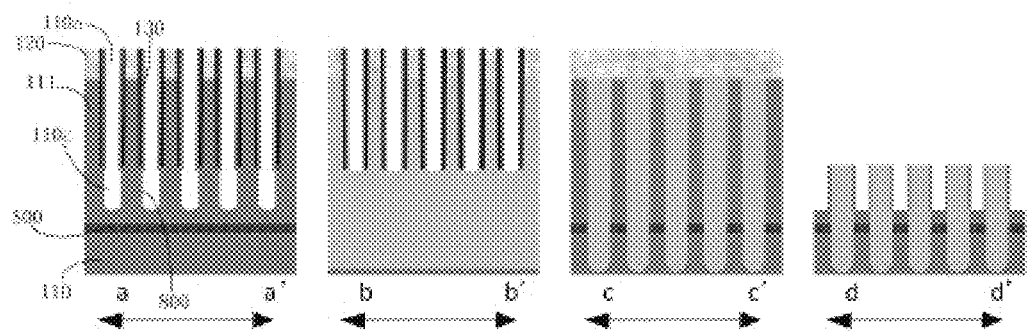

Step S323: Referring to FIG. 23, form a fourth dielectric layer 800 on the sidewall of the first trench 110*a* and a sidewall of the third trench 110*c*.

Figure 24:
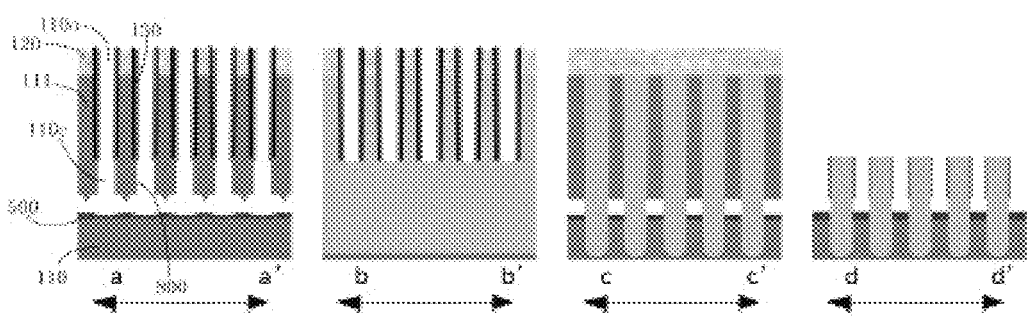

Step S324: Referring to FIG. 24, etch the semiconductor substrate 110 below the third trench 110*c* based on the etch barrier layer 500 to cut off the semiconductor pillar 111.

Figure 25:
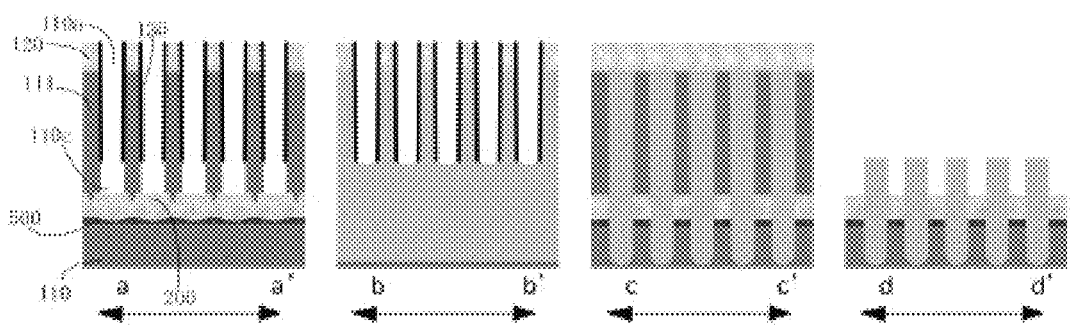

In addition, step S400 includes:

Step S441: Referring to FIG. 25, form the isolation layer 200 between the semiconductor substrate 110 below the third trench and the semiconductor pillar 111.

In step S321, referring to FIG. 22, the bottom of the etch barrier layer 500 may be higher than a trench bottom of the second trench 110*b*, such that the etch barrier layer 500 is not formed at a position with the second trench 110*b*. Therefore, in this case, the etch barrier layers 500 may also extend along the second direction to be alternately arranged with the second trenches 110*b*.

The etch barrier layer 500 may be formed in a manner of ion implantation. Herein, after the formation of the first trench 110*a*, ion implantation is performed on the semiconductor substrate 110 to form the etch barrier layer 500.

However, other embodiments are not limited thereto. For example, alternatively, ion implantation may be performed on the semiconductor substrate 110 after the second trench 110*b* is formed and the second trench 110*b* is filled with the first dielectric layer 140 and before the first trench 110*a* is formed, to form the etch barrier layer 500. Alternatively, ion implantation may be first performed on the semiconductor substrate 110 before other processing is performed on the semiconductor substrate 110, to form the etch barrier layer 500.

In step S322, still referring to FIG. 22, the third trench 110*c* is formed to communicate with the first trench 110*a*.

In step S323, referring to FIG. 23, because the third dielectric layer 130 is provided on the sidewall of the first trench 110*a*, the fourth dielectric layer 800 is specifically located on a side surface of the third dielectric layer 130 and the sidewall of the third trench 110*c*.

In step S324, referring to FIG. 24, during etching based on the etch barrier layer 500, the fourth dielectric layer 800 protects the semiconductor pillar 111. In addition, during the etching, longitudinal etching stops on the etch barrier layer 500 while horizontal etching cuts off the semiconductor pillar 111.

In step S441, referring to FIG. 25, the first trench 110*a*, the third trench 110*c*, and the is region between the semiconductor pillar 111 and the semiconductor substrate 110 may be first filled with an isolation material layer (not shown). Then, the isolation material layer is etched back to remove the isolation material layer in the first trench 110*a* and the third trench 110*c*, and the remaining isolation material layer constitutes the isolation layer 200.

In this embodiment, the isolation layer 200 is injected into the portion removed by etching below the third trench 110*c*. In this case, on the one hand, continuity of the isolation layer 200 can be more effectively ensured, and on the other hand, the isolation layer 200 does not need to be further etched again, thereby reducing process difficulty.

In an embodiment, after step S441 and before step S600, the manufacturing method further includes:

Step S521: Still referring to FIG. 25, remove the fourth dielectric layer 800.

Figure 26:
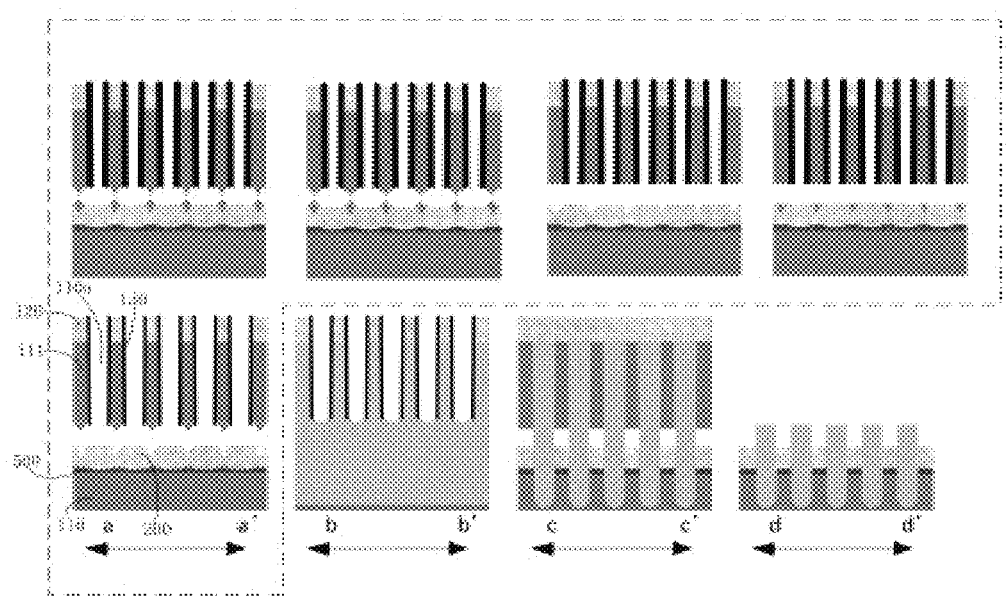

Step S522: Referring to FIG. 26, etch the semiconductor substrate 110 below the first trench 110*a* to cut off the semiconductor pillar 111 again.

In step S521, after the fourth dielectric layer 800 is removed, the semiconductor substrate 110 corresponding to the third trench is exposed.

In step S522, during the etching, the third dielectric layer 130 on the sidewall of the first trench 110a protects the semiconductor pillar 111. In addition, during the etching, longitudinal etching may stop on the isolation layer 200 while horizontal etching cuts off the semiconductor pillar 111.

Five drawings in a dashed box in FIG. 26 are five different schematic structural diagrams taken along a direction aa' and formed under different etching conditions when the semiconductor pillar 111 is cut off through etching below the first trench 110a.

Figure 27:
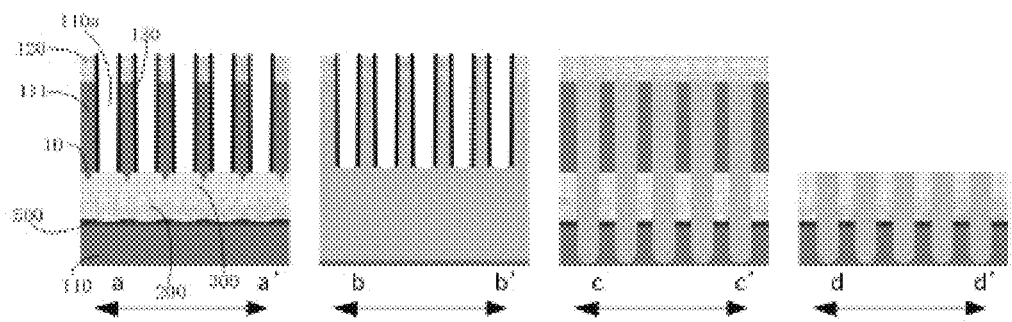

In this case, referring to FIG. 27, the bit line 300 formed in step S600 may fill the portion removed by etching below the first trench 110a.

Figure 29:
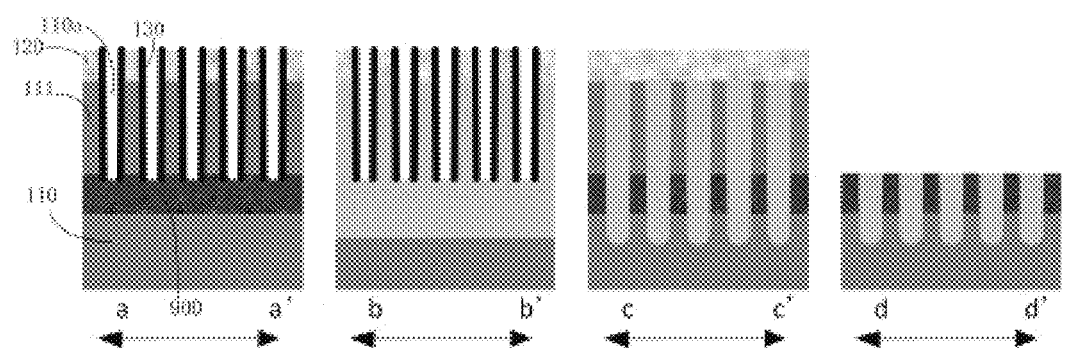
FIG. 29 is a schematic structural cross-sectional view after formation of an ion doped layer in a manufacturing process of a semiconductor structure according to yet another embodiment.

In an embodiment, referring to FIG. 29, before step S300, the manufacturing method includes:
  doping the semiconductor substrate 110 below the first trench 110a to form an ion doped layer 900 extending along the second direction, where the ion doped layer 900 is connected to the semiconductor pillar 111.

In an example, ions doped in the ion doped layer 900 may be As ions, P ions, N ions, or the like. The formation of the ion doped layer 900 can increase an etching rate of the semiconductor substrate 110 below the first trench 110a, thereby accelerating cutting off of the semiconductor pillar 111.

Specifically, the ion doped layer 900 can be formed below the first trench 110a through ion implantation. It can be understood that, ions implanted during the formation of the ion doped layer 900 are different from ions implanted during the formation of the etch barrier layer 500, such that film layers with different functions can be formed.

Certainly, the formation of the ion doped layer 900 is not limited to this manner. For example, the ion doped layer 900 may alternatively be formed by diffusion doping. The diffusion doping may include solid diffusion doping and may also include gas diffusion doping. This is not limited herein.

Figure 16:
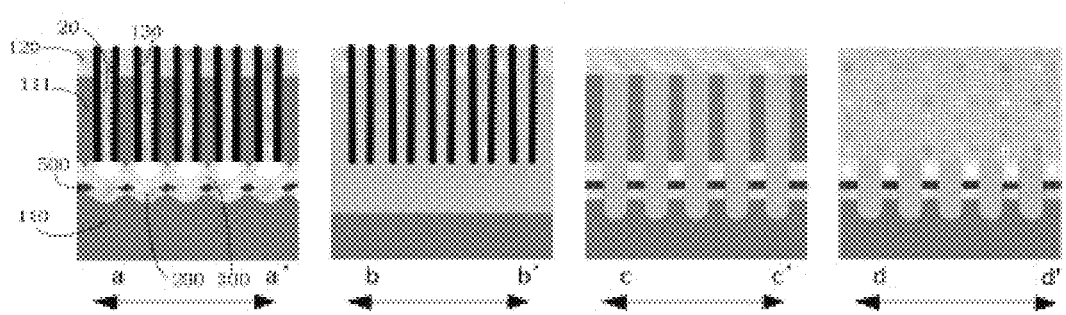
Figure 20:
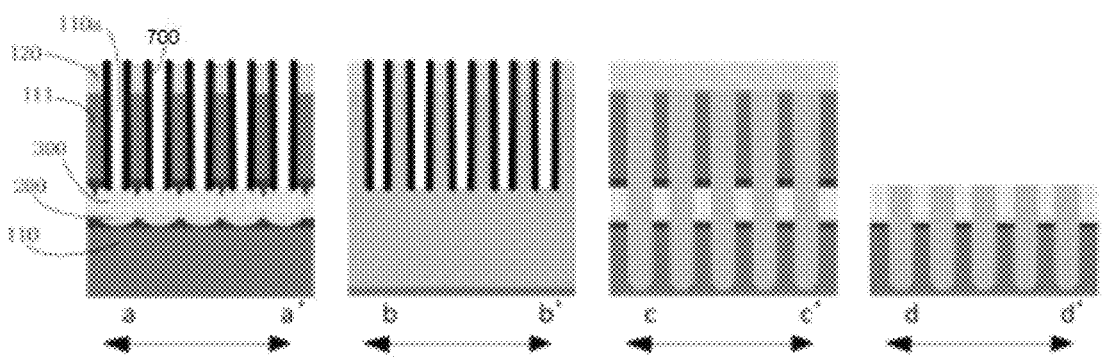
Figure 21:
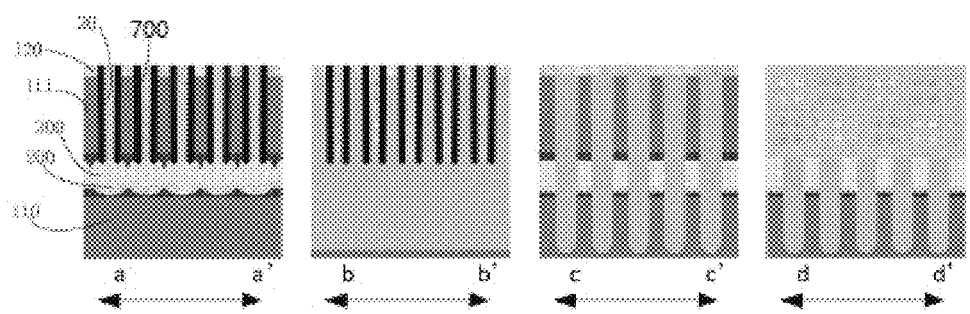
Figure 28:
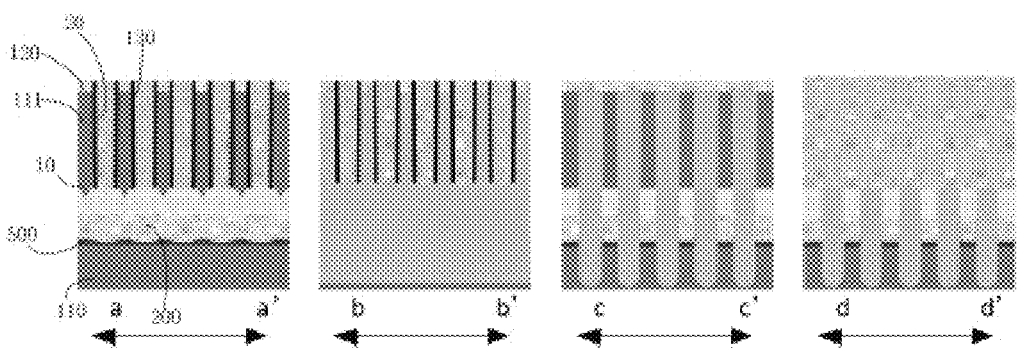

In an embodiment, after step S600, the manufacturing method further includes:
  Step S700: Referring to FIG. 15, FIG. 20, or FIG. 27, perform heat treatment on the bit line 300 to form a metal silicide 10 between the bit line 300 and the semiconductor pillar 111.
  Step S800: Referring to FIG. 16, FIG. 21, or FIG. 28, fill the first trench 110a with an insulating layer 20.

In step S700, after the heat treatment is performed, the bit line 300 may react with the bottom of the semiconductor pillar 111 in contact therewith, thereby forming a metal silicide. The formation of the metal silicide 10 can effectively reduce a contact resistance between a source region or a drain region at the bottom of the semiconductor pillar 111 and the bit line.

In step S800, the insulating layer 20 may include, but is not limited to any one or more of silicon dioxide, silicon nitride, silicon oxynitride, and the like.

In this embodiment, the metal silicide 10 is formed by performing heat treatment on the bit line 300, thereby simplifying a technical process.

Certainly, the formation of the metal silicide 10 is not limited to this manner. For example, in some embodiments, the following steps may be performed before step S600:
  Step S10: Form a metallic material layer between the surface of the isolation layer 200 and the bottom of the semiconductor pillar 111.
  Step S20: Perform heat treatment on the metallic material layer to form a metal silicide 10 at the bottom of the semiconductor pillar 111.
  Step S30: Remove an unreacted portion of the metallic material layer.

There are a plurality of metallic materials that can be used as bit lines, but there are relatively few materials that can react with the semiconductor pillar 111 to form a metal silicide. Therefore, in this case, the separate formation of the metal silicide 10 and the bit line 300 can make material selection of the bit line more flexible.

In an embodiment, after step S800, the manufacturing method further includes:
  Step S900: Form a transistor structure.

Specifically, the third dielectric layer 130 on the sidewall of the first trench 110a may be partially removed to a WL (gate) position. The retained third dielectric layer 130 at the bottom isolates the bit line 300 from the WL. Then, gate metal filling may be sequentially performed for etching back, or the like, to form the WL. In addition, a top region of the semiconductor pillar 111 is exposed to serve as a drain region (or a source region). Subsequently, a suitable material such as an oxide can be injected between drain regions (or source regions).

Certainly, a specific formation manner of the transistor structure is not limited thereto, and the transistor structure may be formed in other manners. This is known to those skilled in the art, and details are not described herein again.

It should be understood that although the steps in the flowchart of FIG. 1 are sequentially displayed according to the arrows, these steps are not necessarily performed in the order indicated by the arrows. Unless clearly described otherwise, the execution order of the steps is not strictly limited, and these steps may be executed in other orders. Moreover, at least some of the steps in FIG. 1 may include a plurality of sub-steps or stages. The sub-steps or stages are not necessarily executed at the same time, but may be executed at different times. The sub-steps or stages are not necessarily carried out sequentially, but may be executed alternately with other steps or at least some of sub-steps or stages of other steps.

In an embodiment, referring to FIG. 16, FIG. 21, or FIG. 28, a semiconductor structure is further provided, including a base 100, an isolation layer 200, and a bit line 300.

The base 100 includes a semiconductor substrate 110. The semiconductor substrate 110 is provided with first trenches 110a extending along a first direction and second is trenches 110b extending along a second direction. The first trenches 110a intersect with the second trenches 110b to form a plurality of semiconductor pillars 111 on the semiconductor substrate 110. The second trench 100b is filled with a first dielectric layer 140, a second dielectric layer 120 is provided on the top of the semiconductor pillar 111, and a third dielectric layer 130 is provided on a sidewall of the first trench 110a.

The isolation layer 200 is located in the semiconductor substrate 110 below the first trench 110a and extends along the second direction.

The bit line 300 is located on the isolation layer 200 and extends along the second direction, where the bit line 300 is connected to the bottom of the semiconductor pillar 111.

In an embodiment, the isolation layer 200 is beak-shaped at a portion opposite to the semiconductor pillar 111.

In an embodiment, the isolation layer 200 is continuous in the second direction.

In an embodiment, a metal silicide 10 is provided between the semiconductor pillar 111 and the bit line 300, and the first trench 110*a* is filled with an insulating layer 20.

For a specific limitation on the semiconductor structure, refer to the limitation on the manufacturing method of a semiconductor structure above. Details are not described herein again.

In this specification, the description of terms such as "an embodiment", "other embodiments", and "some embodiments" means that a specific feature, structure, material or characteristic described in combination with the embodiment(s) or example(s) is included in at least one embodiment or example of the present disclosure. In the specification, the schematic description of the above terms does not necessarily refer to the same embodiment or example.

The technical characteristics of the above embodiments can be employed in arbitrary combinations. In an effort to provide a concise description of these embodiments, not all possible combinations of all technical characteristics of the embodiments are described; however, these combinations of technical characteristics should be construed as disclosed in the description as long as no contradiction occurs.

The above embodiments are only intended to illustrate several implementations of the present disclosure in detail, and they should not be construed as a limitation to the is patentable scope of the present disclosure. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:

1. A semiconductor structure, comprising:
a base, comprising a semiconductor substrate, wherein the semiconductor substrate is provided with first trenches extending along a first direction and second trenches extending along a second direction, the first trenches intersect with the second trenches to form a plurality of semiconductor pillars on the semiconductor substrate, the second trench is filled with a first dielectric layer, a second dielectric layer is provided on a top of the semiconductor pillar, and a third dielectric layer is provided on a sidewall of the first trench;
an isolation layer, located in the semiconductor substrate below the first trenches and extending along the second direction; and
a bit line, located on a surface of the isolation layer and extending along the second direction, wherein the bit line is connected to a bottom of the semiconductor pillar.

2. The semiconductor structure according to claim 1, wherein the isolation layer is beak-shaped at a portion opposite to the semiconductor pillar.

3. The semiconductor structure according to claim 1, wherein the isolation layer is continuous in the second direction.

4. The semiconductor structure according to claim 1, wherein a metal silicide is provided between the semiconductor pillar and the bit line, and the first trench is filled with an insulating layer.

5. A manufacturing method of a semiconductor structure, comprising:
providing a base, comprising a semiconductor substrate, wherein the semiconductor substrate is provided with first trenches extending along a first direction and second trenches extending along a second direction, the first trenches intersect with the second trenches to form a plurality of semiconductor pillars on the semiconductor substrate, the second trench is filled with a first dielectric layer, a second dielectric layer is provided on a top of the semiconductor pillar, and a third dielectric layer is provided on a sidewall of the first trench;
forming, in the semiconductor substrate below the first trenches, an isolation layer extending along the second direction; and
forming, on a surface of the isolation layer, a bit line extending along the second direction, wherein the bit line is connected to a bottom of the semiconductor pillar.

6. The manufacturing method of a semiconductor structure according to claim 5, wherein before the forming, in the semiconductor substrate below the first trenches, an isolation layer extending along the second direction, the manufacturing method comprises:
etching the semiconductor substrate below the first trench to cut off the semiconductor pillar.

7. The manufacturing method of a semiconductor structure according to claim 6, wherein the etching the semiconductor substrate below the first trench to cut off the semiconductor pillar comprises:
forming, below the first trenches, an etch barrier layer extending along the second direction, wherein the etch barrier layer is located in the semiconductor substrate and is spaced apart from the first trench; and
etching the semiconductor substrate below the first trench based on the etch barrier layer to cut off the semiconductor pillar.

8. The manufacturing method of a semiconductor structure according to claim 7, wherein the forming, below the first trenches, an etch barrier layer extending along the second direction comprises:
performing ion implantation on the semiconductor substrate to form the etch barrier layer.

9. The manufacturing method of a semiconductor structure according to claim 7, wherein the forming, in the semiconductor substrate below the first trenches, an isolation layer extending along the second direction comprises:
forming a sacrificial layer on a bottom surface of the semiconductor pillar and partial surface of the etch barrier layer opposite thereto; and
performing thermal oxidation on the etch barrier layer exposed by the sacrificial layer to form the isolation layer, wherein the isolation layer is beak-shaped at a portion opposite to the semiconductor pillar; and
before the forming, on a surface of the isolation layer, a bit line extending along the second direction, the manufacturing method further comprises:
removing the sacrificial layer.

10. The manufacturing method of a semiconductor structure according to claim 7, wherein the forming, in the semiconductor substrate below the first trenches, an isolation layer extending along the second direction comprises:
forming a sacrificial layer on a bottom surface of the semiconductor pillar and partial surface of the semiconductor substrate opposite thereto; and
performing thermal oxidation on the semiconductor substrate exposed by the sacrificial layer to form the isolation layer, wherein the isolation layer is beak-shaped at a portion opposite to the semiconductor pillar; and before the forming, on a surface of the isolation layer, a bit line extending along the second direction, the manufacturing method further comprises:
removing the sacrificial layer.

11. The manufacturing method of a semiconductor structure according to claim 7, wherein the forming, in the semiconductor substrate below the first trenches, an isolation layer extending along the second direction comprises:
forming a sacrificial layer on a bottom surface of the semiconductor pillar and partial surface of the etch barrier layer opposite thereto; and
performing thermal oxidation on the etch barrier layer and the semiconductor substrate that are exposed by the sacrificial layer to form the isolation layer, wherein the isolation layer is beak-shaped at a portion opposite to the semiconductor pillar; and
before the forming, on a surface of the isolation layer, a bit line extending along the second direction, the manufacturing method further comprises:
removing the sacrificial layer.

12. The manufacturing method of a semiconductor structure according to claim 7, wherein the forming, in the semiconductor substrate below the first trenches, an isolation layer extending along the second direction comprises:
forming a sacrificial layer on a bottom surface of the semiconductor pillar and a surface of the etch barrier layer and partial surface of the semiconductor substrate that are opposite thereto; and
performing thermal oxidation on the semiconductor substrate exposed by the sacrificial layer to form the isolation layer, wherein the isolation layer is beak-shaped at a portion opposite to the semiconductor pillar; and
before the forming, on a surface of the isolation layer, a bit line extending along the second direction, the manufacturing method further comprises:
removing the sacrificial layer.

13. The manufacturing method of a semiconductor structure according to claim 7, wherein the forming, in the semiconductor substrate below the first trenches, an isolation layer extending along the second direction comprises:
filling the first trench and a region between the semiconductor pillar and the semiconductor substrate with an isolation material layer;
etching back the isolation material layer to the bottom of the semiconductor pillar;
forming a supplementary dielectric layer on the sidewall of the first trench; and continuing to etch back the isolation material layer to form the isolation layer on at least one of the etch barrier layer or the semiconductor substrate.

14. The manufacturing method of a semiconductor structure according to claim 7, wherein the forming, in the semiconductor substrate below the first trenches, an isolation layer extending along the second direction comprises:
filling the first trench and a region between the semiconductor pillar and the semiconductor substrate with an isolation material layer; and
etching back the isolation material layer to form the isolation layer on at least one of the etch barrier layer or the semiconductor substrate.

15. The manufacturing method of a semiconductor structure according to claim 6, wherein the etching the semiconductor substrate below the first trench to cut off the semiconductor pillar comprises:
forming, below the first trenches, an etch barrier layer extending along the second direction, wherein the etch barrier layer is spaced apart from the first trench;
etching the semiconductor substrate at a bottom of the first trench to form a third trench, wherein the third trench is spaced apart from the etch barrier layer;
forming a fourth dielectric layer on the sidewall of the first trench and a sidewall of the third trench; and
etching the semiconductor substrate below the third trench based on the etch barrier layer to cut off the semiconductor pillar; and
the forming, in the semiconductor substrate below the first trenches, an isolation layer extending along the second direction comprises:
forming the isolation layer between the semiconductor substrate and the semiconductor pillar below the third trench.

16. The manufacturing method of a semiconductor structure according to claim 15, wherein after the forming the isolation layer between the semiconductor substrate and the semiconductor pillar below the third trench, and before the forming, on a surface of the isolation layer, a bit line extending along the second direction, the manufacturing method comprises:
removing the fourth dielectric layer; and
etching the semiconductor substrate below the first trench to cut off the semiconductor pillar again.

17. The manufacturing method of a semiconductor structure according to claim 6, wherein before the etching the semiconductor substrate below the first trench to cut off the semiconductor pillar, the manufacturing method comprises:
doping the semiconductor substrate below the first trenches to form an ion doped layer extending along the second direction, wherein the ion doped layer is connected to the semiconductor pillar.

18. The manufacturing method of a semiconductor structure according to claim 5, wherein after the forming, on a surface of the isolation layer, a bit line extending along the second direction, the manufacturing method further comprises:
performing heat treatment on the bit line to form a metal silicide between the bit line and the semiconductor pillar; and
filling the first trench with an insulating layer.

19. The manufacturing method of a semiconductor structure according to claim 18, wherein after the filling the first trench with an insulating layer, the manufacturing method further comprises:
forming a transistor structure.

20. The manufacturing method of a semiconductor structure according to claim 5, wherein before the forming, on a surface of the isolation layer, a bit line extending along the second direction, the manufacturing method further comprises:
forming a metallic material layer between the surface of the isolation layer and the bottom of the semiconductor pillar;
performing heat treatment on the metallic material layer to form a metal silicide at the bottom of the semiconductor pillar; and
removing an unreacted portion of the metallic material layer.

* * * * *